United States Patent [19]
Adelson

[11] Patent Number: 4,661,986
[45] Date of Patent: Apr. 28, 1987

[54] DEPTH-OF-FOCUS IMAGING PROCESS METHOD

[75] Inventor: Edward H. Adelson, Princeton, N.J.

[73] Assignee: RCA Corporation, Princeton, N.J.

[21] Appl. No.: 611,962

[22] Filed: May 18, 1984

[30] Foreign Application Priority Data

Jun. 27, 1983 [GB] United Kingdom ................. 8317407

[51] Int. Cl.$^4$ .............................................. G06K 9/36
[52] U.S. Cl. ....................................... 382/41; 382/17; 382/49; 358/227
[58] Field of Search ........................... 382/17, 41, 49; 358/182, 183, 185, 227, 3, 88, 160, 166; 354/400, 407, 408

[56] References Cited

U.S. PATENT DOCUMENTS

| 4,523,230 | 6/1985 | Carlson et al. ....................... 358/167 |
| 4,561,747 | 12/1985 | Ohno et al. .......................... 354/408 |
| 4,584,704 | 4/1986 | Ferren ................................. 358/227 |

OTHER PUBLICATIONS

"Optional Sectioning," by Kenneth R. Castleman, *Digital Image Processing*, 351-379, Prentice-Hall, Inc., 1979.
"Segmentation and Estimation of Image Region Properties through Cooperative Hierarchial Computation," by Peter J. Burt, et al., *IEEE Transactions on Systems, Man, and Cybernetics*, vol. SMC-11, No. 12, 802-809, Dec., 1981.
"The Laplacian Pyramid as a Compact Image Code," by Peter J. Burt, et al., *IEEE Transactions on Communications*, vol. COM-31, No. 4, 532-540, Apr. 1983.
Fast Algorithms for Estimating Local Image Properties," by Peter J. Burt, *Computer Vision, Graphics, and Image Processing* 21, 368-382 (1983).
"Tree and Pyramid Structures for Coding Hexagonally Sampled Binary Images," by Peter J. Burt, *Computer Graphics and Image Processing* 14, 271-280 (1980).
"Pyramind-based Extraction of Local Image Features with Applications to Motion and Texture Analysis," by Peter J. Burt, *SPIE*, vol. 360, 114-124.
"Fast Filter Transforms for Image Processing," by Peter J. Burt, *Computer Graphics and Image Processing* 16, 20-51, 1981.
"A Multiresolution Spline with Applications to Image Mosaics," by Peter J. Burt, et al., Image Processing Laboratory, Electrical, Computer, and Systems Engineering Department, Rensselaer Polytechnic Institute, Jun. 1983.
"The Pyramind as a Structure for Efficient Computation," by Peter J. Burt, Image Processing Laboratory, Electrical and Systems Engineering Department, Rensselaer Polytechnic Institute, Jul. 1982.

*Primary Examiner*—Leo H. Boudreau
*Assistant Examiner*—Jose L. Couso
*Attorney, Agent, or Firm*—Joseph S. Tripoli; George J. Seligsohn

[57] ABSTRACT

An improved-focus 2-D image is derived from an assemblage of M separately focused 2-D images of the same 3-D scene by (1) employing the Burt Pyramid image analyzing technique to separately analyze each of the M separately focused images into N similar sets of pixel samples, (2) selecting, on a pixel-by-pixel basis from each group of M corresponding sets of the assemblage, the best focused pixel, to derive a single analyzed image of N sets of improved-focus pixels, and (3) employing the Burt Pyramid image synthesizing technique to synthesize the improved-focus 2-D image from the single analyzed image of N sets.

8 Claims, 5 Drawing Figures

DEPTH-OF-FOCUS IMAGING PROCESS METHOD

BACKGROUND OF THE INVENTION

1. Field of the Invention

This invention relates to an image-processing method and, more particularly, to an image-processing method for deriving a single improved-focus two-dimensional (2-D) image of a three-dimensional (3-D) scene from a plurality of separately-focused 2-D images of this 3-D scene.

The term "scene", as used herein, means a particular region of 3-D space including all objects situated within that particular region.

2. Description of the Prior Art

As is known in optics, a pin-hole imaging system has a very deep depth-of-focus (i.e., depth-of-field), but has extremely poor light-gathering properties and poor resolution due to diffraction. Therefore, substantially all imaging is accomplished with lens imaging systems, rather than pin-hole imaging systems.

A large aperture lens (i.e., a lens having large numerical aperture and small F number) has greater light-gathering properties and is capable of providing an image of higher spatial resolution than is a small aperture lens. However, a large aperture lens inherently exhibits a relatively small depth-of-focus. For this reason, it is often not possible to produce a 2-D image of a relatively deep 3-D given scene in which both relatively close and relatively distant objects within the scene appear in good focus in the 2-D image.

The problem of insufficiency of depth-of-focus exists when a light microscope is used to examine a 3-D specimen carrying structures that extend in its depth dimension (e.g., microbiology specimens). When such a 3-D specimen is viewed in the microscope, all structures that are not in or near the focal plane are blurred or altogether invisible. One way to overcome this problem is the use of serial sectioning, a technique that involves slicing the specimen to produce a series of thin sections that may be studied individually to develop an understanding of the three-dimensional structure. However, such sectioning gives rise to other problems, such as damage or distortion of the structures carried by the specimen.

Reference is made to pages 351–360 of the book *Digital Image Processing*, by K. R. Castleman, published by Prentice-Hall in 1979. A three-dimensional image processing technique is described on these pages that permits a three-dimensional display to be produced by digitizing the specimen with the focal plane situated at various levels along the optical axis (equivalent to optical scanning) and then processing each resulting image to remove the defocused information from structures in neighboring planes. This approach makes it possible to roughly separate each section image into two components—a sharp component of objects in the plane of focus, and a blurred component contributed by objects lying in the other planes. By extracting the sharp components and stacking them up, a 3-D microscope scene can be displayed with a significant increase in the depth-of-field. However, this approach is only approximately correct, and it requires rather accurate a priori knowledge of the optical system parameters (i.e., optical axis positions and point spread function). Further, published photographs generated by this technique show an unnatural high-pass quality.

Reference is now made to an image-processing algorithm developed by Dr. Peter J. Burt. Dr. Burt implemented his algorithm (hereinafter referred to as the "Burt Pyramid") by computer in non-real time to effect an analysis of the two-dimensional spatial frequencies of a sampled image into a plurality of separate sets of pixel samples that define specific spatial frequency bands. Each spatial frequency band need not have a "brick wall" roll-off at given cut-off frequencies, but may have a relatively gradual roll-off because the Burt Pyramid inherently compensates for the introduction of spurious frequencies, due to aliasing, caused by a gradual roll-off. In the case of a gradual roll-off, a nominal width of a band is defined as the frequency interval between nominal cut-off frequencies at which some preselected value of attentuation in the gradual roll-off takes place. By way of example, if the highest spatial frequency of interest of the image is no greater than $f_0$, the highest frequency band may cover an octave nominal bandwidth from $f_0/2$ to $f_0$ (having a center frequency at $3f_0/4$); the next-to-highest frequency band may cover an octave nominal bandwidth from $f_0/4$ to $f_0/2$ (having a center frequency at $3f_0/8$), etc. Below the lowest frequency nominal bandwidth octave is a remnant band. Further, the spatial coordinates of corresponding pixel samples of all of the sample sets are the same as one another.

The following list of articles, authored or co-authored by Dr. Burt, describe in detail various aspects of the Burt pyramid:

"Segmentation and Estimation of Image Region Properties Through Cooperative Hierarchial Computation," by Peter J. Burt, et al., *IEEE Transactions on Systems, Man, and Cybernetics*, Vol. SMC-11, No. 12, 802–809, December 1981.

"The Laplacian Pyramid as a Compact Image Code," by Peter J. Burt, et al., *IEEE Transactions on Communications*, Vol. COM-31, No. 4, 532–540, April 1983.

"Fast Algorithms for Estimating Local Image Properties," by Peter J. Burt, *Computer Vision, Graphics, and Image Processing* 21, 368–382 (1983).

"Tree and Pyramid Structures for Coding Hexagonally Sampled Binary Images," by Peter J. Burt, *Computer Graphics and Image Processing* 14, 271–280 (1980).

"Pyramid-based Extraction of Local Image Features with Applications to Motion and Texture Analysis," by Peter J. Burt, *SPIE*, Vol 360, 114–124.

"Fast Filter Transforms for Image Processing," by Peter J. Burt, *Computer Graphics and Image Processing* 16, 20–51 (1981).

"A Multiresolution Spline with Applications to Image Mosaics," by Peter J. Burt, et al., Image Processing Laboratory, Electrical, Computer, and Systems Engineering Department, Rensselaer Polytechnic Institute, June 1983.

"The Pyramid as a Structure for Efficient Computation," by Peter J. Burt, Image Processing Laboratory, Electrical and Systems Engineering Department, Rensselaer Polytechnic Institute, July, 1982.

Reference is further made to co-pending U.S. patent application, Ser. No. 596,817, entitled "Real-Time Hierarchal Pyramid Signal Processing Apparatus," filed Apr. 4, 1984, by Carlson, Arbeiter and Bessler, and assigned to the same assignee as the present application. This Carlson, et al. application, inter alia, discloses a two-dimensional spatial-frequency spectrum analyzer using pipe-line architecture to perform spectral analysis in delayed real time, and also discloses apparatus using pipe-line architecture fo synthesizing in delayed real time signals descriptive of the sample field analyzed by this two-dimensional spatial frequency spectrum analyzer. The analyzer and synthesizer disclosed in this copending Carlson, et al. patent application are capable of implementing the Burt pyramid in delayed real time.

SUMMARY OF THE INVENTION

The image-processing method of the present invention makes use of the Burt pyramid, implemented either in non-real time (as disclosed by Burt) or implemented in delayed real time (as disclosed in the aforementioned co-pending Carlson, et al. patent application) for processing M (where M is a first plural integer) separately focused two-dimensional images of a given three-dimensional scene to derive therefrom a single improved-focus two-dimensional image of the given three-dimensional scene. More specifically, the method comprises the steps of first dividing the respective spatial-frequency spectrums of the M two-dimensional images into M substantially similar assemblages of N separate specified pixel sample sets that define N spatial frequency bands (where N is a second plural integer). The respective sample densities of each individual group of sets that define corresponding ones of the specified bands of the M assemblages are substantially the same as one another. The second step is to select, as a given function of the relative levels of a sub-group of corresponding samples of each of the individual groups of sets, a single one of the corresponding samples of that sub-group to derive thereby respective single sets of improved-focus pixel samples for each of the N bands. The third and final step is to combine corresponding pixel samples of the respective single sets to derive thereby the improved-focus two-dimensional image.

The present invention is particularly suitable for use in microscopy for deriving an improved-focus 2-D image of a 3-D microscope specimen. Another important use of the image-processing method of the present invention is deriving a television image display of a 3-D scene in which both foreground objects and background objects in the scene appear in-focus in the television image display, despite significant differences in the respective positions of the foreground and background objects in the depth dimension of the 3-D scene.

DESCRIPTION OF THE PREFERRED EMBODIMENTS

Figure 1:
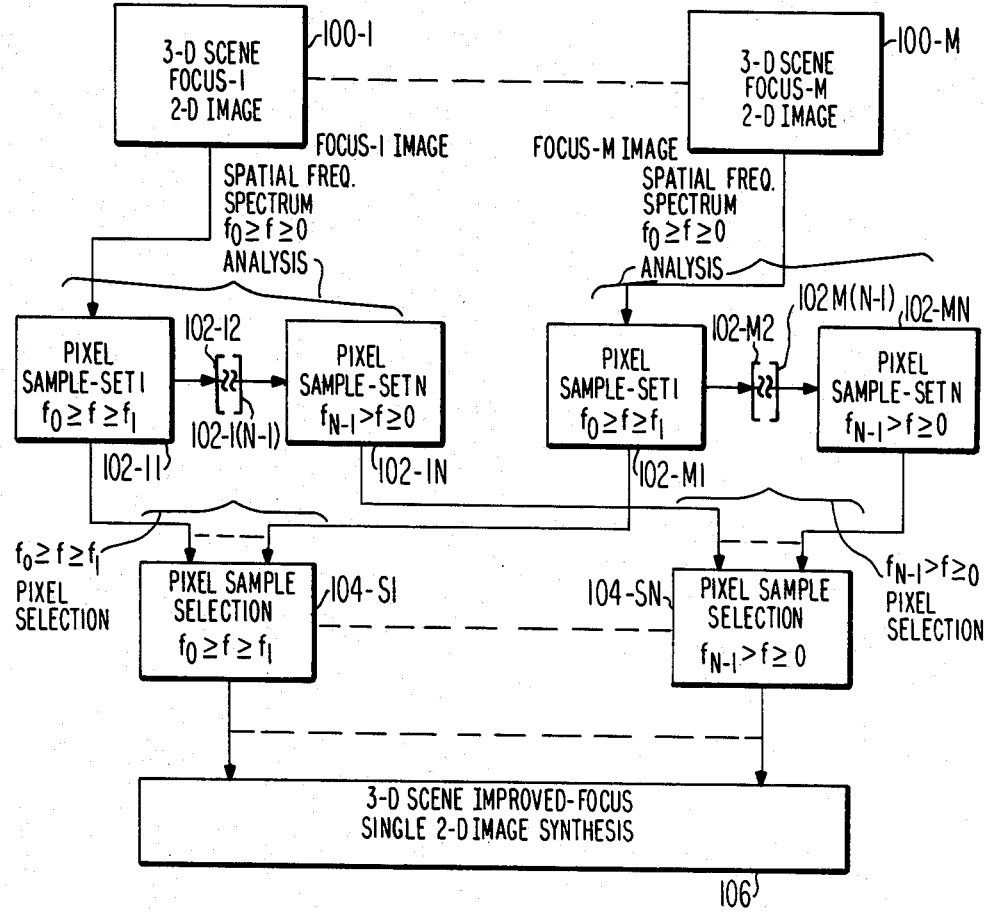
FIG. 1 is a flow chart illustrating the successive steps of the image-processing method of the present invention.

As indicated in FIG. 1, the image processing method of the present invention operates on M separately focused two-dimensional images of the same 3-D scene. These M images are respectively designated "3-D Scene Focus 1 2-D Image" 100-1 ... "3-D Scene Focus-M 2-D Image" 100-M. Each of separately-focused images 100-1 ... 100-M can be either in sampled or non-sampled analog form, or, alternatively, in sampled digital form. If the 3-D scene is fixed in time (i.e., does not include moving objects), separate images 100-1 ... 100-M of the fixed 3-D scene can be made successively at different times with the same lensing system adjusted at each of these times to a different focus. In this case, the resulting 2-D images are stored in respective memories. Alternatively, M separate lensing systems, each having a different focus, may be used simultaneously to produce in real time all of images 100-1 ... 100-M of a fixed 3-D scene. If the 3-D scene is not fixed (i.e., includes moving objects) it becomes essential that all of images 100-1 ... 100-M be simultaneously produced in real time.

Each of images 100-1 ... 100-M has a two-dimensional spatial-frequency spectrum in which the highest spatial frequency of interest is no greater than $f_0$. Images 100-1 ... 100-M may be prefiltered so that the spatial frequency spectrum of each image contains no spatial frequency greater than $f_0$. However, although not desirable, some image spatial frequencies, not of interest, that exceed $f_0$ can be tolerated, so long as they are of relatively small intensity. In any case, the next step of the image-processing method shown in FIG. 1 is to analyze the spatial frequency spectrum of each one of separate images 100-1 ... 100-M in accordance with the teachings of the Burt pyramid and/or of the aforesaid copending patent application of Carlson, et al.

More specifically, as shown in FIG. 1, analysis of the spatial frequency spectrum of image 100-1, which includes all frequencies of interest between $f_0$ and zero (D.C.) divides the image 100-1 spatial frequency spectrum into N separate specified spatial frequency bands constituted respectively by the N pixel (picture element) sample sets 102-1 ... 102-N (where N is a second plural integer). Thus, whether or not image 100-1 before analysis is a sampled image or a non-sampled image, after analysis each of the N-band component-image sets 102-1 ... 102-N of image 100-1 is a sampled image.

As indicated in FIG. 1, the highest frequency band of the spatial frequency spectrum of interest of image 100-1 (which overlaps a portion of the preceding frequency band) is comprised by the first pixel sample set 102-11. The band of sample set 102-11 includes all those frequencies of interest between the upper frequency interest $f_0$ and a lower specified frequency $f_1$. The pixel sample set 102-12 of the next-to-highest frequency band of the spatial frequency spectrum of image 100-1 covers the frequency interval extending from frequency $f_1$ to a still lower specified frequency $f_2$ (FIG. 1). Thus, as indicated in FIG. 1, the frequency band of the Nth pixel sample set 102-1N is comprised of all those spatial frequencies of the image 100-1 spectrum below $f_{N-1}$, where $f_{N-1}$ is the lowest frequency in the band of (N-1)th pixel sample set 102-1 (N-1) of the image 100-1 spectrum.

The spatial frequency spectrum of an image is divided into (N-1) pixel sample sets that have respective overlapping pass bands that, by way of example, may be about one octave in bandwidth each (i.e., the respective peak center frequencies of adjacent bands are separated in frequency by substantially one octave), and a single remnant band which includes all those spatial frequencies that are lower than the lowest octave pass band of the (N−1) separate pixel sets. In this case, the 2-D spatial frequency $f_1$, in each of its two dimensions, is about one-half of the spatial frequency $f_0$ in the corresponding dimension. In like manner, $f_2$ is about $f_1/2$ ... and $f_{N-1}$ is about $f_{N-2}/2$.

As the maximum frequency in each frequency band becomes smaller, the pixel sample density in that band can also be smaller. Therefore, as taught in the Burt Pyramid, each of the respective sample sets, such as sample sets 102-11 ... 102-1N, has a predetermined certain sample density, with the certain sample density of a higher-numbered sample set normally being less (and never being more) than the lower-numbered sample set that immediately precedes it. Thus, if each of the pass bands is normally about one octave in bandwidth, the sample density in each dimension of a higher-numbered sample set can be one-half that of the lower-numbered sample set that immediately precedes it.

The spatial frequency spectrum of each other one of the M separately focused 2-D images is analyzed in a manner substantially similar to the analysis of the spatial frequency spectrum of the Focus-1 image 100-1, described above in detail. The 2-D images 100-2 ... 100(M-1) are not explicitly shown in FIG. 1. However, each of these images, as well as the Focus-M image 100-M (which is shown in FIG. 1) are analyzed into substantially similar sets of N separate specified spatial frequency bands of pixel samples (such as pixel sample sets 102-M1 ... 102-MN). Thus, as indicated in FIG. 1, the respective spatial frequency spectrums of the M two-dimensional images 100-1 ... 100-M are divided into M substantially similar assemblages of N separate pixel sample sets that define N specified spatial frequency bands.

The total number of pixel sample sets is M×N. This total number of pixel sample sets also can be considered to be made up of N individual groups, with each individual group of sets defining corresponding ones of the N specified bands of the M assemblages. In this case, the first group is comprised of sets 102-11 ... 102-M1; the second group is comprised of sets 102-12 ... 102-M2 (and so forth), and the last group is comprised of sets 102-1N ... 102-MN. Further, the respective sample densities of each individual group of sets that define corresponding ones of the specified bands of the M assemblages is the same as one another.

The next step is selecting, from each sub-group of corresponding samples of each of the individual group of sets, a single one of the corresponding samples of that sub-group, to derive thereby respective single sets of improved-focus pixel samples for each of the N bands. This operation is indicated in FIG. 1 by pixel sample selection 104-S1 ... 104-SN. The general criterion for selection is a given function of the relative level of the sub-group of corresponding samples of each of the individual groups of sets. In its most simple specific form, that single one of corresponding samples of each sub-group is selected that has the highest absolute value level (where level is indicative of the relative amplitude of each of the corresponding samples of each sub-group of M pixel samples).

In a more complex specific form of the present invention, the selection is accomplished as a given function of both the relative level of each sub-group of corresponding samples of each of the individual group of sets and the relative distance in the depth dimension of the given 3-D scene represented by each of the corresponding samples of that sub-group. This permits the selection of that single one of the corresponding samples of each sub-group that has an absolute value level that (1) exceeds by at least a certain threshold value the absolute value level of any of the corresponding samples representing a distance in the depth dimension of the 3-D scene which is less than the distance represented by that single one of the corresponding samples, but (2) is not exceeded by more than a certain threshold value by the absolute value level of any of the corresponding samples representing a distance of the depth dimension which is more than the distance represented by that single one of the corresponding samples. Thus, the selection process is biased to a certain extent in favor of foreground over background objects in the 3-D scene.

The result of the selection process is to reduce the M separately focused images of N pixel sample sets to a derived single improved-focus assemblage of N pixel sample sets. The final step 106 is to employ the Burt Pyramid (using either Burt's technique of using a computer that operates in non-real time or, alternatively, the pipe-line architecture technique disclosed in the aforesaid Carlson, et al. patent application operating in delayed real time) to synthesize an improved focus single 2-D image of the 3-D scene.

In order to more concretely illustrate the image-processing method of the present invention, two practical applications thereof are being disclosed. Both practical applications make use of techniques disclosed in detail in the aforementioned co-pending Carlson, et al. patent application. However, the first of these applications relates to real-time television employing a compound television camera with separately focused 2-D images of foreground objects and background objects in a 3-D scene, while the second of these applications relates to use of a television microscope for successively obtaining a series of separately focused 2-D images of different optical sections of a 3-D microscopic specimen being observed. The specific circuitry of each of the respective 2-D spatial frequency analyzers and signal synthesizers, per se shown in FIG. 3 and in FIG. 5; used for implementing my method in delayed real time, are not part of my invention, but are the work of Arbeiter and Bessler (co-inventors of the aforementioned co-pending Carlson, et al. patent application).

In the first of these practical applications, the component images are obtained using a plurality of similar lenses directed to have a like field of view along a common optical axis, but with each lens adjusted to place a different image plane in focus. In the second practial application, the composite image is comprised of the in-focus portions of a succession of images obtained using a single lens with intervening adjustments of the distance of the in-focus image plane, assuming the image to exhibit no appreciable motion. The two practical applications will now be described, beginning with the first practical application.

Figure 2:
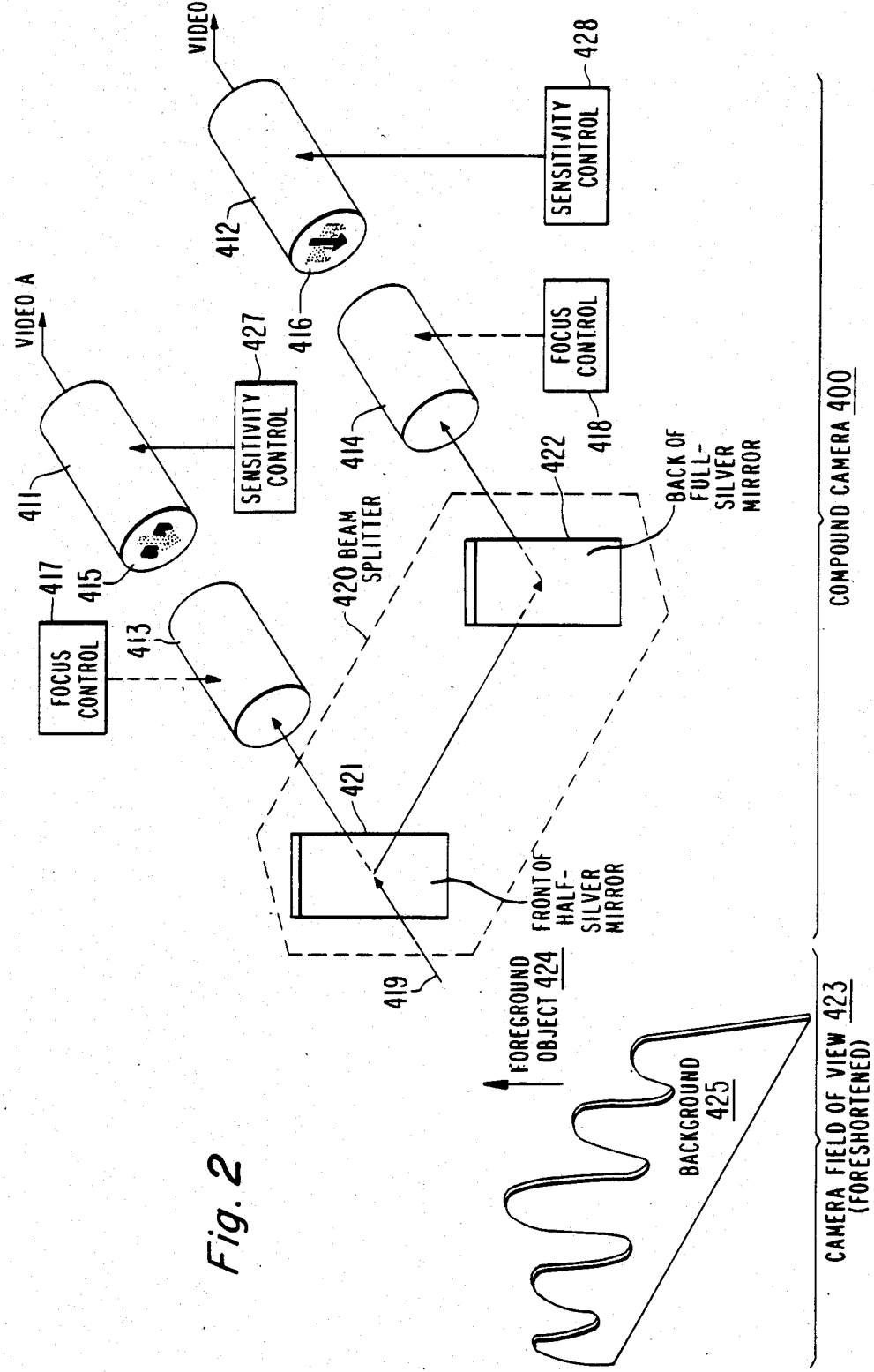
FIG. 2 is a block diagram schematically showing the camera head of a compound television camera employing plural-focusing.

The FIG. 2 schematically-shown monochrome television camera head 400 is a compound television camera that comprises first and second component cameras 411 and 412 having respective optical lenses 413 and 414 for projecting images into their respective imager portions 415 and 416. Lens 413 and 414 are of similar focal length and have respective focus controls 417 and 418, which are independent of each other. A beam splitter 420 is used to cause lenses 413 and 414 to project images received along a common input optical axis 419 into imager portions 415 and 416 of cameras 411 and 412. Beam splitter 420 typically comprises a half-silvered mirror 421 at $\pi/4$ radian angle to input optical axis for passing half of the input light to lens 413 for focussing on imager 415 and for reflecting the other half of the input light to a full-silvered mirror 422. This mirror 422 corrects the perversion of image caused by reflection from mirror 421, reflecting input light to lens 414 for focussing on imager 16. Further, in practice other optical elements and/or more complicated geometric arrangements of the optical elements from that shown in schematic FIG. 2 may be employed to better match the optical path lengths to the two cameras, and thereby ensure substantially similar fields of view for the two cameras.

The field of view 423 of compound camera 410 is foreshortened in FIG. 2, including a foreground object 424 in the near field and a background 425 in the far field. Focus control 417 will be presumed to be adjusted so lens 413 places the image of background 425 in focus in imager 415, with the image of foreground object 424 out of focus. Focus control 418 is presumed to be adjusted so lens 414 places the image of foreground object 424 in focus on imager 416, with the image of background 425 out of focus.

Cameras 411 and 412 are shown with separate sensitivity controls 427 and 428. Preferably cameras 411 and 412 are CCD cameras capable of supplying over a field time a matrix of non-interlaced video samples in the resolution conventionally associated with a frame of interlaced video samples. Other types of camera may be used together with frame buffer stores to provide full resolution sampling instead of using this type of CCD camera.

The output signals from cameras 411 and 412 are labelled VIDEO A and VIDEO B respectively in FIG. 2. A composite video signal VIDEO C is to be generated in the FIG. 3 apparatus, which video signal describes an image comprising the in-focus portions of both the images respectively described by VIDEO A and by VIDEO B.

Figure 3:
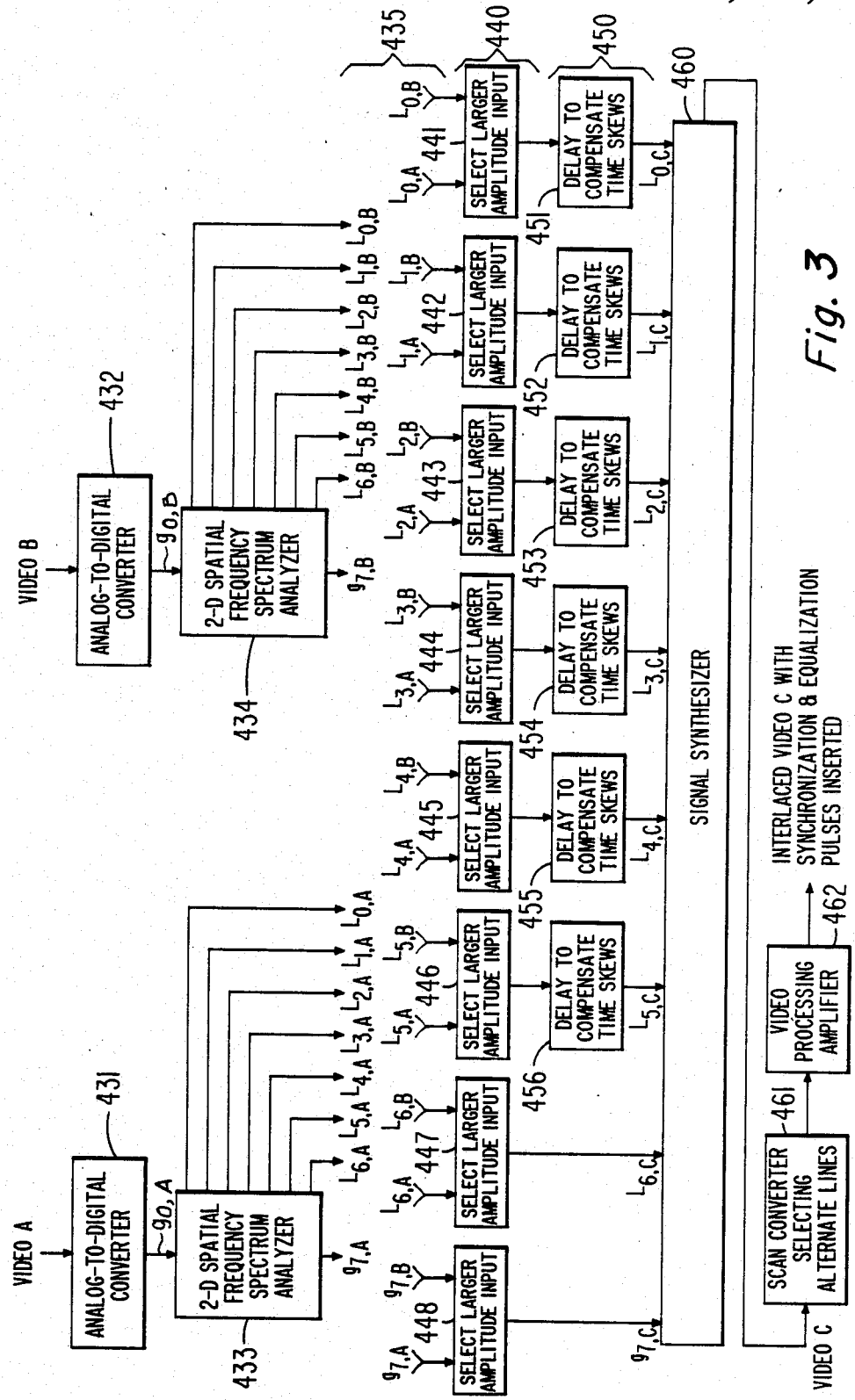
FIG. 3 is a block diagram of apparatus for combining the output video from the two differently focusing component cameras of the FIG. 2 compound television camera, to obtain a video signal descriptive of an image comprising the in-focus portions of both its input video signals.

In FIG. 3 VIDEO A and VIDEO B signals are digitized in analog-to-digital converters (ADC's) 431 and 432 respectively. The sampled data pixel output $g_{0,A}$ of ADC 431 is supplied as input signal to a spectrum analyzer 433. Spectrum analyzer 433 separates the pixel output $g_{0,A}$ into eight pixel sets defining respectively a high-pass spectrum $L_{0,A}$; a succession of band-pass spectra $L_{1,A}$, $L_{2,A}$, $L_{3,A}$, $L_{4,A}$, $L_{5,A}$ and $L_{6,A}$ of decreasing spatial frequency; and a remnant low-pass spectrum $g_{7,A}$. The sampled data pixel output $g_{0,B}$ of ADC 432 is analyzed in a spectrum analyzer 434 like spectrum analyzer 433 to provide eight corresponding pixel sets defining respectively a high-pass spectrum $L_{0,B}$; band pass spectra $L_{1,B}$, $L_{2,B}$, $L_{3,B}$, $L_{4,B}$, $L_{5,B}$ and $L_{6,B}$; and a remnant low-pass spectrum $g_{7,B}$.

Connections of the analyzer 433 and 434 outputs to a selection network 440 via an interconnection interface 435 are not drawn in, to keep FIG. 3 from becoming overly complex. Selection network 440 selects the larger absolute value amplitude (level) pixel of the VIDEO A and VIDEO B corresponding pixels in each spectrum pixel sets as the spectral component pixel set of the composite pixel sets video signal VIDEO C descriptive of a synthesized image having both background 425 and foreground object 424 simultaneously in focus.

Selection network 440 includes circuitry 441 for selecting the larger absolute value level pixel of its inputs $L_{0,A}$ and $L_{0,B}$ as the highest frequency component $L_0$ of the VIDEO C signal. For example, circuitry 441 may comprise two tri-state latches for selectively forwarding their respective VIDEO A and VIDEO B input signal pixels responsive to control signals from the |VIDEO A|$\geq$|VIDEO B| and |VIDEO B|$\geq$|VIDEO A| outputs of a digital comparator receptive of VIDEO A and VIDEO B for comparison. Selection network 440 further includes circuitry 442 for selecting the larger of the corresponding pixels of the $L_{1,A}$ and $L_{1,B}$ pixel sets as a spectral component pixel set $L_{1,C}$ of VIDEO C; circuitry 443 for selecting the larger of the corresponding pixels of the $L_{2,A}$ and $L_{2,B}$ pixel sets as a spectral component $L_{2,C}$ of VIDEO C; circuitry 444 for selecting the larger of the corresponding pixels of the $L_{3,A}$ and $L_{3,B}$ pixel sets as a spectral component $L_{3,C}$ of VIDEO C; circuitry 445 for selecting the larger of the corresponding pixels of the $L_{4,A}$ and $L_{4,B}$ pixel sets as a spectral component $L_{4,C}$ of VIDEO C; circuitry 446 for selecting the larger of the corresponding pixels of the $L_{5,A}$ and $L_{5,B}$ pixel sets as a spectral component $L_{5,C}$ of VIDEO C; and circuitry 447 for selecting the larger of the corresponding pixels of $L_{6,A}$ and $L_{6,B}$ pixel sets as a spectral component $L_{6,C}$ of VIDEO C; and circuitry 448 for selecting the larger of the corresponding pixels of the $g_{7,A}$ and $g_{7,B}$ pixel sets as a spectral component $g_{7,C}$ of VIDEO C.

A differential delay network 450, shown as comprising delay lines 451–456, compensates for the difference between the time skew of corresponding pixels of the respective spectrum components introduced in spectrum analyzers 433 and 434 and the time skew required to combine the corresponding pixels of the respective components into a video C signal in a signal synthesizer 460. Signal synthesizer 460 is of the same type as would be used to re-synthesize a signal without error from the spectrum analysis provided by spectrum analyzer 433 or the identical spectrum analyzer 434. VIDEO C output from signal synthesizer is supplied to a scan converter 461, which deletes alternate lines in each field and stretches the remaining lines in time so as to generate an interlaced video signal. Typically this scan conversion is accomplished using a serial-in-parallel-out register, into which pixels are loaded at a first pixel scan rate on alternate lines of input video, to recurrently side-load a parallel-in-serial-out register, from which pixels are serially clocked out at a second pixel scan rate half the first. This interlaced video signal is applied to a conventional video processing amplifier 462 for insertion of synchronization and equalization pulses.

The portions of VIDEO C descriptive of background 425 are taken from the VIDEO A signal generated by camera 411. Background 425 is in-focus in imager 415 from which VIDEO A response is derived, but out-of-focus in imager 416 from which VIDEO B response is derived. So VIDEO A has greater high spatial frequency content descriptive of background 425 than VIDEO B. The relatively large spectrum analyzer 433 pixel outputs responsive to VIDEO A will be selected in network 440 in preference to the relatively small corresponding spectrum analyzer 434 pixel outputs responsive to VIDEO B.

The portions of VIDEO C descriptive of foreground object 424 are taken from the VIDEO B signal generated by camera 412. Foreground object 24 is in-focus in imager 16 from which VIDEO B response is derived, but out-of-focus in imager 415 from which VIDEO A response is derived. So there is greater higher spatial frequency content descriptive of foreground object 424 in VIDEO B than in VIDEO A, so selection in network 440 is in preference to VIDEO B in the portions of image descriptive of foreground object 424.

The low-spatial-frequency content of VIDEO A and of VIDEO B tends to be similar. The spectrum analyzers 433 and 434 are shown separating the visual frequencies into eight ranges including six middle octaves, designed to overlap approximately the five middle octaves of the seven-octave 30 to 3600 Hz/radian spatial frequency range of the human visual response, as referred to screen edge radius of a television receiver screen. Commercial experience may reveal it not to be necessary to extend band-pass analysis to the lower spatial frequencies where VIDEO A and VIDEO B are pretty much alike.

Figure 4:
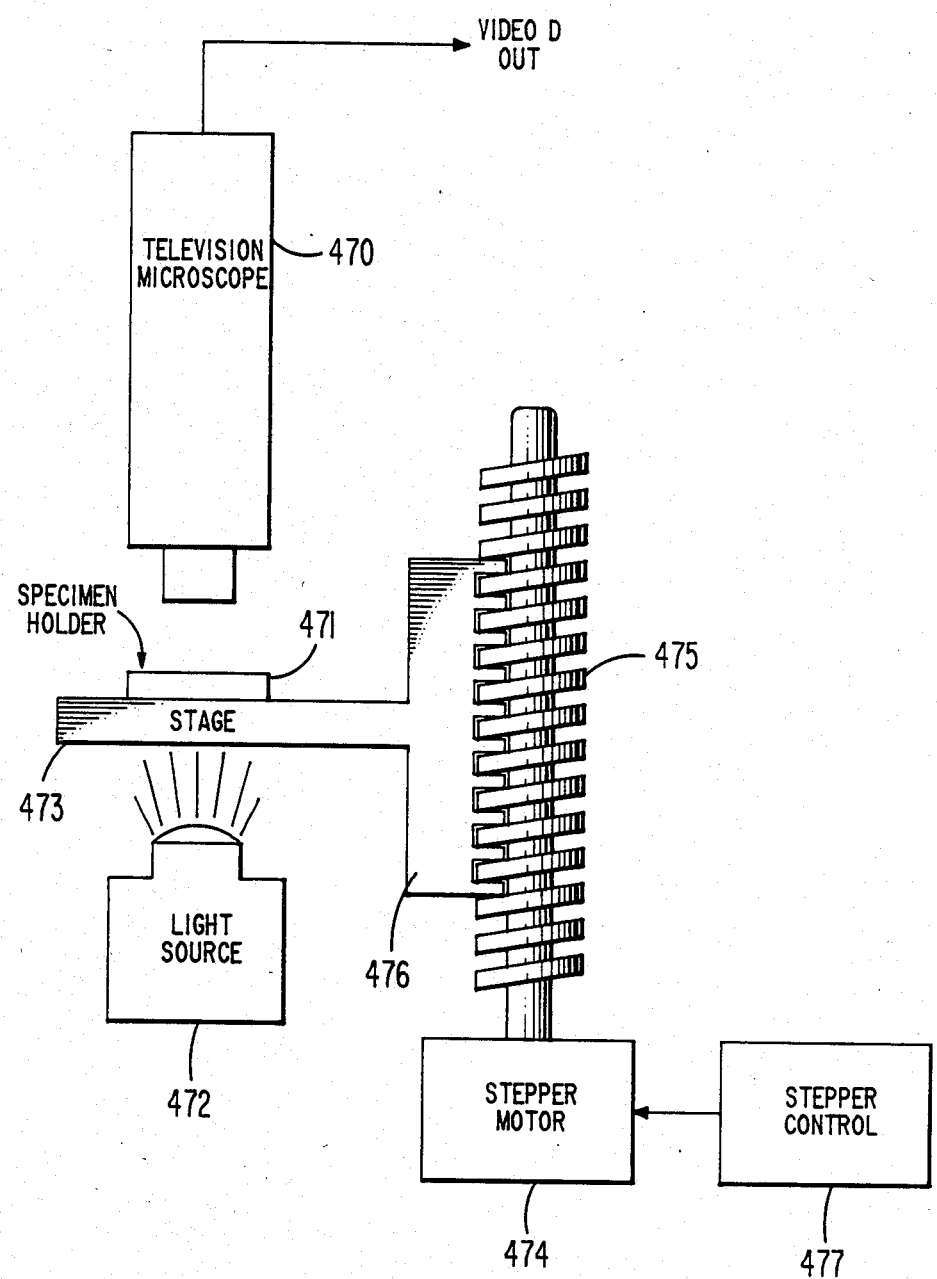
FIG. 4 is a block diagram schematically showing a television microscope adapted for stepped change in focusing with passage of time.

FIG. 4 shows a television microscope 470. The specimen in its holder 471 is placed in a succession of different positions between television microscope 470 and a light source 472 responsive to adjustment of the height of its supporting stage 473. The image plane in focus is at a fixed distance from the lens of the television microscope 470. The successive changes in the positioning of television microscope 470 and stage 473 with specimen holder 471 atop it are arranged for by using a stepper motor 474 to periodically rotate a lead screw 475 by a fixed increment. A rack 476 engaging lead screw 475 converts the rotary motion to translatory motion of the rack 476 and attached stage 473. Stepper control electronics 477 energizes stepper motor 474 in intervals between scannings of the specimen image by television microscope 470. The video output signal VIDEO D from television microscope 470 comprises a series of optical sections of the specimen. Only those portions in the very shallow depth-of-field image plane appear in focus in an optical section, so the in-focus condition can be used to describe a third dimension of the image, as is well known.

Figure 5:
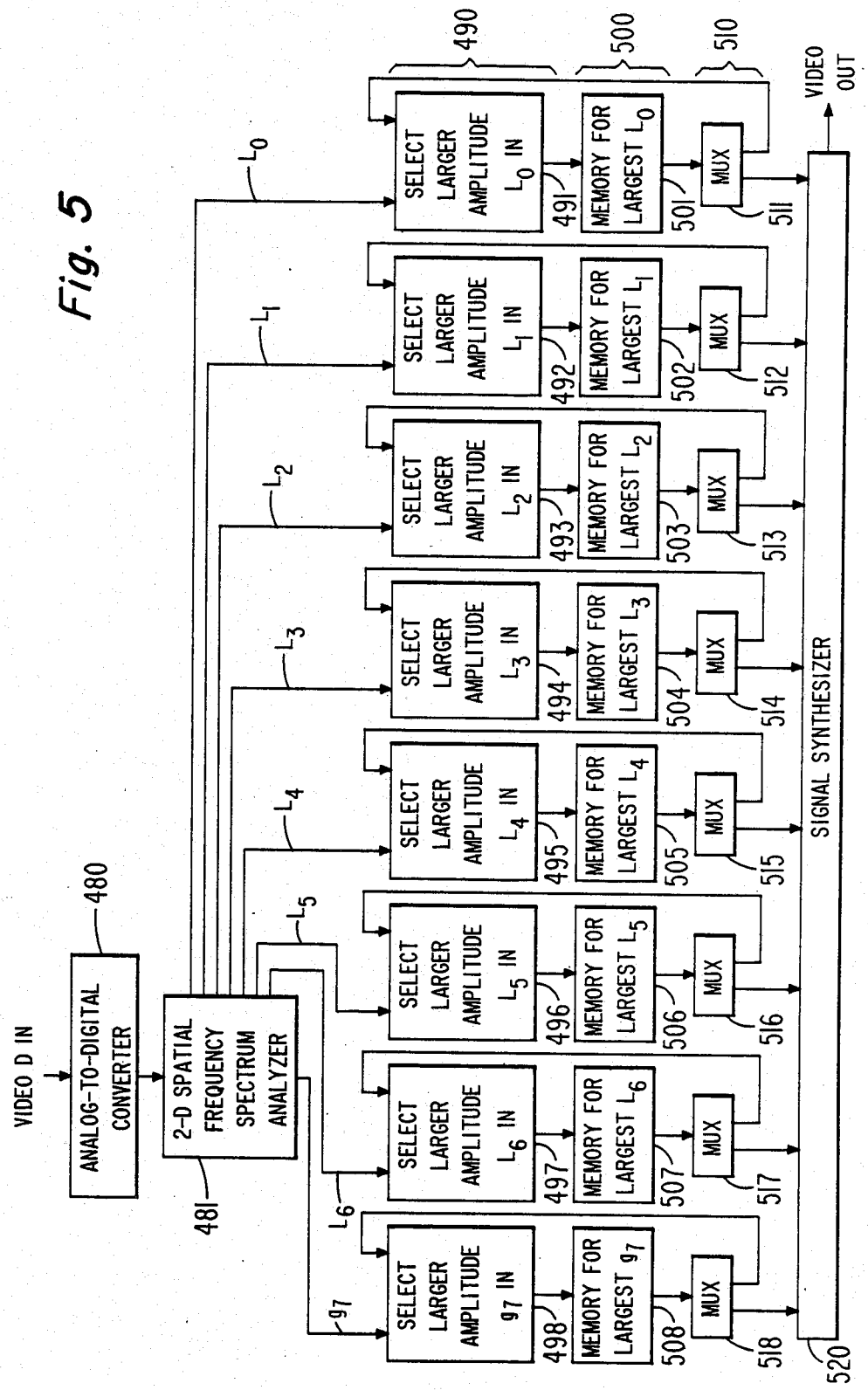
FIG. 5 is a block diagram of novel apparatus for processing successive images from the FIG. 4 television microscope to provide a composite image comprising the in-focus portions of those successive images.

FIG. 5 diagrams the electronics used to process the successive frames of VIDEO D from the television microscope. VIDEO D is digitized in analog to digital converter 480, and the digitized sampled data pixels are supplied as input to a spectrum analyzer 481 for conversion to pixel-set spectrum components $L_0$, $L_1$, $L_2$, $L_3$, $L_4$, $L_5$, $L_6$ and $g_7$. Selector circuitry 490 includes elements 491, 492, 493, 494, 495, 496, 497 and 498 which compare pixels of these spectra to corresponding pixels of spectra read from a spectrum analysis memory 500 the portions 501, 502, 503, 504, 505, 506, 507 and 508 of which store image spectra in bit-map organization. A set 510 of multiplexers 511, 512, 513, 514, 515, 516, 517 and 518 are used to apply the read-outs from spectrum analysis memory 500 to selector circuitry 490 at this time. Selector circuitry selects the larger absolute-valued level of corresponding pixels of each one of spectrum components directly from spectrum analyzer 481 and from spectrum analysis memory 500, and the selected pixels of the respective spectrum components are used to replace the former contents of memory 500. When the whole succession of VIDEO D frames at different focus settings of television microscope 470 is complete, the set 510 of multiplexers forward the spectrum analyses pixel sets remaining in memory 500 to signal synthesizer 520 to be synthesized into video output signal.

During the process of selecting the larger of each of the corresponding pixels of the respective spectral components, one can store in bit-map-organized memory (not shown) the frame numbers associated with updates of the highest spatial frequency spectrum to change in memory 500. These numbers can afford a basis for z-axis modulation of picture element position in a "three-dimensional" television display using the video output of signal synthesizer 520 as the basis for x-axis and y-axis positioning of picture elements.

(It should be noted that the electronic circuitry of FIGS. 3 and 5 is of a sort generally applicable to selecting between corresponding pixels in a plurality of spectrum analyses. That is, the selection between pixels of the spectra can be based on other criteria than their relative levels. Furthermore, the various 2-D images which are analyzed may be from entirely different 3-D scenes. In this case, the selection between corresponding pixels can create a new 2-D image representing a combination of the analyzed images.)

While FIGS. 2–5 have been described in the context of dealing with monochromatic images, the extension of the image processing techniques to polychromatic images is straightforward. Beam splitting of the light received by each camera into three portions subjected to subtractive color filtering and detection by respective imager elements is used to generate video signals descriptive of three primary or complementary-to-primary colors. These signals are each processed in the same way as described for monochromatic signals. This generates signals descriptive of the same colors, but with out-of-focus information suppressed in favor of in-focus information. The signals are converted to red, green and blue signals for driving a color kinescope directly or converted to a format for color television transmission.

What is claimed is:
1. A method for processing M (where M is a first plural integer) two-dimensional images of a given three-dimensional spatial scene, which images are separately focused in the depth dimension, to derive therefrom a single improved-focus two-dimensional image of said given three-dimensional scene, each of said M images being defined by a spatial-frequency spectrum corresponding thereto; said method comprising the steps of:
   (a) dividing the respective spatial-frequency spectra of said M two-dimensional images into M substantially similar assemblages of N separate sets of pixel samples having sample levels that vary in height and defining N specified spatial frequency bands (where N is a second plural integer), each of said N separate sets occurring at a sample density that corresponds therewith and the respective sample densities of each individual group of sets that define corresponding ones of said specified bands of said M assmblages being substantially the same as one another;
   (b) selecting, as a given function of the relative levels of a sub-group of corresponding samples of each of said individual group of sets, a single one of the corresponding samples of that sub-group to derive thereby respective single sets of improved-focus pixel samples for each of said N bands; and

(c) combining corresponding pixel samples of said respective single sets to derive thereby said improved-focus two-dimensional image.

2. The method defined in claim 1, wherein step (b) comprises:
   selecting that single one of corresponding samples of each of said sub-groups that has the highest absolute-value level.

3. The method defined in claim 1, wherein each of said M separately focused two-dimensional images is focused at a different focus-distance in the depth dimension of said given three dimensional scene, and step (b) comprises:
   selecting as a given function of both the relative levels of each sub-group of corresponding samples of each of said individual groups of sets and the relative focus-distance in the depth dimension of said given three-dimensional scene represented by the corresponding samples of that sub-group, a single one of the corresponding samples of that sub-group to derive thereby respective single sets of improved-focus pixel samples for each of said N bands.

4. The method defined in claim 3, wherein step (b) comprises:
   selecting that single one of the corresponding samples of each of said sub-group that has a level that (1) exceeds by at least a certain threshold value the level of any of the corresponding samples representing a focus-distance in the depth dimension of said three-dimensional scene which is less than the focus-distance represented by said single one of said corresponding samples, but (2) is not exceeded by more than a certain threshold value by the level of any of the corresponding samples representing a focus-distance in the depth dimension which is more than the focus-distance represented by said single one of the corresponding samples.

5. The method defined in claim 1, wherein each of the respective spectra that correspond to said M two-dimensional images has an uppermost spatial frequency and is divided into $(N-1)$ separate spatial frequency pass bands including a highest spatial frequency pass band having a peak center frequency substantially equal to $\frac{3}{4}$ of its spectrum's uppermost spatial frequency, each of which pass bands has a peak center frequency that is separated in frequency from the peak center frequency of any pass band adjacent thereto by substantially one octave, and a single remnant band which includes all those spatial frequencies of that respective spectrum which are lower than the spatial frequencies of the lowest peak-center-frequency pass band of said $(N-1)$ separate pass bands.

6. The method defined in claim 5, wherein step (b) comprises:
   selecting that single one of corresponding samples of each of said sub-groups that has the highest level.

7. The method defined in claim 5, wherein each of said M separately focused two-dimensional images is focused at a different focus-distance in the depth dimension of said given three dimensional scene, and step (b) comprises:
   selecting as a given function of both the relative levels of each sub-group of corresponding samples of each of said individual groups of sets and the relative focus-distance in the depth dimension of said given three-dimensional scene represented by the corresponding samples of that sub-group, a single one of the corresponding samples of that sub-group to derive thereby respective single sets of improved-focus pixel samples for each of said N bands.

8. The method defined in claim 7, wherein step (b) comprises:
   selecting that single one of the corresponding samples of each of said sub-group that has a level that (1) exceeds by at least a certain threshold value the level of any of the corresponding samples representing a focus-distance in the depth dimension of said three-dimensional which is less than the focus-distance represented by said single one of said corresponding samples, but (2) is not exceeded by more than a certain threshold value by the level of any of the corresponding samples representing a focus-distance in the depth dimension which is more than the distance represented by said single one of the corresponding samples.

* * * * *